United States Patent [19]

Dinteman

[11] Patent Number: 5,583,430
[45] Date of Patent: Dec. 10, 1996

[54] APPARATUS FOR AUTOMATIC TESTING OF COMPLEX DEVICES

[75] Inventor: Bryan J. Dinteman, Beaverton, Oreg.

[73] Assignee: Credence Systems Corporation, Fremont, Calif.

[21] Appl. No.: 229,998

[22] Filed: Apr. 19, 1994

Related U.S. Application Data

[63] Continuation of Ser. No. 919,837, Jul. 27, 1992, abandoned.

[51] Int. Cl.$^6$ ............................ G01R 31/28; G01R 31/02
[52] U.S. Cl. .......................... 324/158.1; 324/73.1
[58] Field of Search ............................... 324/73.1, 158.1, 324/765; 371/22.1, 22.3, 22.6, 25.1, 15.1; 368/113, 118; 437/8

[56] References Cited

U.S. PATENT DOCUMENTS

| | | | |
|---|---|---|---|
| 4,544,882 | 10/1985 | Flora | 324/73.1 |
| 4,724,378 | 2/1988 | Murray et al. | 324/74 |
| 4,816,750 | 3/1989 | Van der Kloot et al. | 324/73.1 |
| 4,835,459 | 5/1989 | Hamlin et al. | 324/73.1 |
| 4,931,723 | 6/1990 | Jeffrey et al. | 324/73.1 |
| 5,025,205 | 6/1991 | Mydill et al. | 324/73.1 |
| 5,126,953 | 6/1992 | Bergen et al. | 324/73.1 |
| 5,189,365 | 2/1993 | Ikeda et al. | 324/73.1 |
| 5,386,189 | 1/1995 | Nishimura et al. | 324/158.1 |

FOREIGN PATENT DOCUMENTS 0339286  2/1989  European Pat. Off. .
0389683  3/1990  European Pat. Off. .

OTHER PUBLICATIONS

Richard Nass, "Process Analog and Digital Signals on a PC," *Electronic Design*, Apr. 2, No. 7, Cleveland, Ohio, pp. 106–112.

James Seaton and Jeffrey Axelbank, "Designing a High-Speed Vector Bus to Meet the Requirements of Analog LSE Testing," *1982 IEEE Test Conference Paper 21.3*, Boston, Massachusetts, pp. 620–627 (no month available).

*Primary Examiner*—Vinh P. Nguyen
*Attorney, Agent, or Firm*—Smith-Hill and Bedell

[57] ABSTRACT

Apparatus for testing an integrated circuit device (DUT) having an input port and an output port comprises multiple state devices each having multiple states that occur in a predetermined sequence and each having an output port at which it provides an event signal representative of its current state. At least a first of the state devices is an emitting device that emits an event marker signal at a predetermined time in advance of entering a predefined state, at least a second of the state devices is a receiving device that responds to receipt of an event marker signal in a predetermined manner after lapse of a predetermined time, at least one of the state devices has its output port connected to the input port of the DUT, and at least one of the state devices is a measurement device connected to the output port of the DUT. An interconnection matrix is connected to each state device and allows each state device to communicate an event marker signal to each other state device.

23 Claims, 3 Drawing Sheets

APPARATUS FOR AUTOMATIC TESTING OF COMPLEX DEVICES

This is a continuation of Application No. 07/919,837, filed Jul. 27, 1992, and now abandoned.

BACKGROUND OF THE INVENTION

This invention relates to apparatus for automatic testing of complex devices, and is particularly applicable to apparatus for automatic testing of complex electronic circuit devices. Such devices may be fabricated in a variety of technologies and over a wide range of integration scales.

In manufacture of electronic circuit devices, it is important to be able to verify that a particular unit meets the functional specifications prescribed for that model of circuit. Such an electronic circuit device is typically tested either manually, with discrete test and measurement instruments, or by using an automated test equipment (ATE) system if one with sufficient capability is available. Use of an automated test system is preferred over the manual method of testing for reasons of speed, accuracy and repeatability, but an automated test system often cannot provide adequate capabilities to perform all required tests for full and accurate device parameter verification.

An ATE system comprises a test socket that is mated with connection pins of the device under test (DUT), a stimulus device for applying a preset sequence of stimuli to the DUT and an acquisition device for receiving signals representative of the response of the DUT to the stimuli. Computer control of stimulus and acquisition instrumentation resources integrate the whole into a system that is instructed through software to perform complex testing processes.

In a conventional ATE system, the stimulus device and the acquisition device operate under timing control of a single master event controlling device which specifies the phase relationships between all activities in a given test procedure. In order to provide maximum accuracy while also providing minimum test time, Digital Signal Processing (DSP) techniques are employed for testing of analog parameters and relationships between analog (continuously variable) and digital (discretely variable) activities. The primary requirement for rapidly-executing DSP test techniques is coherent timing between stimulus and acquisition activities. Coherent timing requires precise integer ratios between frequencies of execution and renders absolute accuracy of the frequencies of much less importance. For this reason, a conventional coherent automated test system contains a single master timing reference from which all stimulus and acquisition device state timing is derived.

This timing approach allows many characteristics of the DUT to be measured, but is subject to some limitations. For example, the conventional coherent ATE system, having a single master event controlling device, is not well suited to testing certain device parameters. For example, an important figure-of-merit relative to an analog-to-digital converter (ADC) is the linearity of the quantization process utilized for the conversion of a continuously-variable analog signal to discrete values in an evenly spaced digital scale. The conversion linearity depends on the accuracy of the sampler portion of the ADC. Certain high-speed samplers employ a circuit configuration that is not stable for more than a short period of time after being placed into a known stable calibration state and released for operation. Such a sampler therefore requires repeated calibration. The ADC is placed in its calibration state by a discrete stimulus signal from an external source, typically a micro-controller that is controlling operation of the apparatus containing the ADC. Although the ADC is continuously sampling and producing output data, the output data produced during a calibration cycle is invalid. An ADC with an unstable sampler of this type exhibits an overall operating cycle composed of a calibration cycle followed by a conversion cycle, which may contain multiple sampling and quantizing cycles.

The conversion linearity of an ADC with an unstable sampler may depend on the duration of the calibration cycle and the interval between calibration cycles. This implies that in order to measure conversion linearity of such an ADC, the tester must include stimulus and acquisition devices that operate intermittently. The requirement of coherent timing forces the stimulus, acquisition and controlling devices of the ATE system to operate at differing frequencies of state alteration as their respective tasks are executed. This creates great difficulty for a single event master device to accurately control starting, stopping, pausing and resumption of the various device activities as a test procedure executes.

Unstable configuration ADC sampling circuits are typically employed in applications intended for very high speed operation with many bits of resolution, such as high performance video graphics for computer-aided design tools. The combination of both high conversion rate and fine resolution implies that a large amount of data must be acquired in order to provide sufficient data points to adequately measure parameters to an accuracy corresponding to that resolution. The required number of data points cannot be acquired at the operating rate of the ADC in the maximum period of time available between successive calibration cycles. Therefore, the test process is forced to be discontinuous, with data gathered over multiple active periods between calibration cycles.

Ideally, the acquisition device captures only data generated by the ADC under test during active periods between calibration cycles. Additionally, the resulting data record is ideally a single, continuous set of all data points with no redundancy and a seamless continuity so that subsequent DSP data reduction algorithms are simple and rapidly executing. This would require that the test process be interrupted and resumed in response to the periodic calibration cycles so that the resulting data record appears to be a single continuous acquisition.

A conventional ATE system exhibits difficulty in management of the phase between measurement discontinuities among the separate test resource devices so that an extended acquisition period is required to ensure that all data is captured through redundancy over a number of active periods of the ADC under test. As a result, it is necessary to eliminate from the data record any data acquired while the ADC was undergoing calibration, and this can lead to difficulty in accurately and rapidly measuring such parameters as the linearity of the conversion process due to extensive pre-processing of the data record before the ideal seamless, complete-without-redundancy data record is produced.

Further, the conventional ATE system is not well suited to testing of a more general set of devices composed of functional blocks that operate in different time domains. The ADC discussed above embodies at least three time domains (the analog input sourcing device, the digital controlling device and the digital output acquisition device). A typical video processing circuit might include an ADC that operates under control of a synchronization signal associated with the analog input, a digital processing circuit connected to a standard digital interface and a digital-to-analog converter (DAC) producing an analog representation of the processed input signal for output in accordance with a video display standard. The establishment of the specific timing requirements of these different time domains leads to difficulty in testing characteristics that involve more than one functional block.

SUMMARY OF THE INVENTION

In accordance with the present invention there is provided an apparatus for testing a complex device under test (DUT) having an input port and an output port, said apparatus comprising a plurality of state devices each having multiple states that occur in a predetermined sequence and each having an output port at which it provides an event signal representative of its current state, at least a first of the state devices being an emitting device that emits an event marker signal at a predetermined time in advance of entering a predefined state, at least a second of the state devices being a receiving device that responds to receipt of an event marker signal in a predetermined manner after lapse of a predetermined time, at least one of the state devices having its output port connected to the input port of the DUT, and at least one of the state devices being a measurement device connected to the output port of the DUT. The apparatus also comprises an interconnection matrix connected to each state device and allowing each state device to communicate an event marker signal to each other state device.

BRIEF DESCRIPTION OF THE DRAWINGS

For a better understanding of the invention, and to show how the same may be carried into effect, reference will now be made, by way of example, to the accompanying drawings in which.

DETAILED DESCRIPTION

Figure 1:
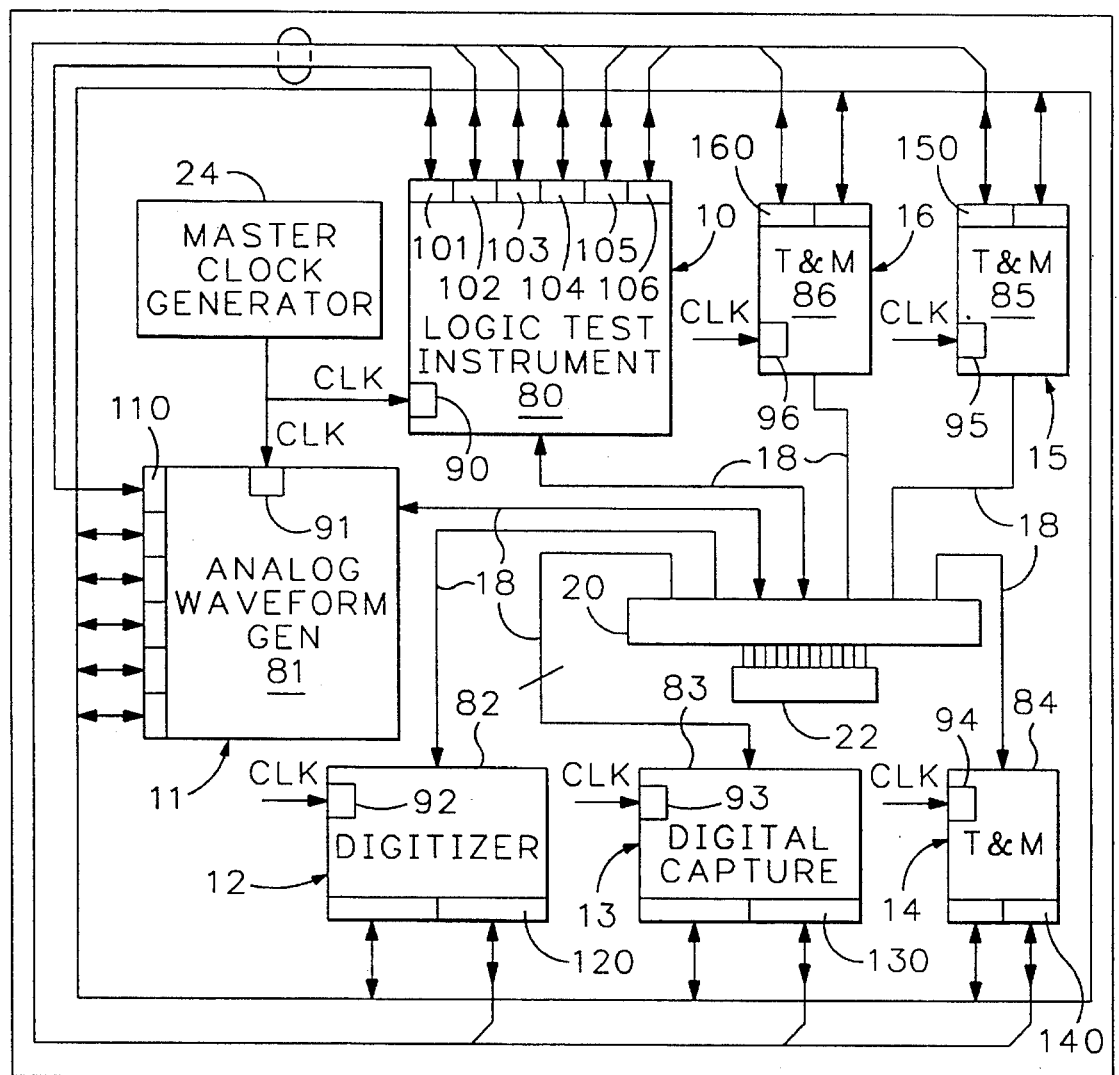
FIG. 1 is a block diagram of apparatus in accordance with the present invention.

The tester shown in FIG. 1 comprises multiple quasi-independent instruments 10–16, including a logic test instrument 10 and test and measurement (T & M) instruments 11–16. The instruments 10–16 are connected through lines 18 and a socket 20 to a device under test 22. The instruments 10–16 may have single line socket connection ports or multiple line socket connection ports, depending on the nature of the instruments, the nature of the DUT and the nature of the test that is to be carried out. The socket 20 may have upwards of one hundred pins, although some pins might not be used for a particular test. The different instruments 10–16 are at different distances from the socket, and accordingly the signal propagation time between the socket and the instruments is not uniform over all instruments.

The logic test instrument is an autonomous instrument having substantially all the functions of a conventional digital tester. Thus, the logic test instrument is able to generate a digital stimulus signal and to receive and measure a digital response signal. Some conventional digital testers might have capabilities that go beyond what is necessary for the logic test instrument. For example, the logic test instrument might be one of the Vista series testers sold by Credence Systems Corporation of Fremont, Calif.

The T & M instruments 11–16 are autonomous instruments, each dedicated to a particular T & M function. For example, the T & M instruments might include an analog waveform generator 11, an analog waveform digitizer 12, a digital capture port 13, and other instruments 14, 15, 16. The instruments 10–16 comprise respective state machines 80–86. The state machine of each of the T & M instruments has an active state and a quiescent state. The analog waveform generator 11 supplies an analog output signal to the DUT. In the active state of the state machine 81, the analog output signal varies in accordance with a user-selected waveform, e.g. a stair step waveform or a sinusoidal waveform, and in the quiescent state, the output signal remains at a constant level. When the analog waveform digitizer 12 is in use, it receives an analog output signal from the DUT. In its active state, the state machine 82 of the analog waveform digitizer converts the analog signal from the DUT to digital form, and in its quiescent state the state machine 82 interrupts conversion of the analog signal to digital form. When the digital capture port is 13 in use, the digital capture port receives a digital output signal from the DUT. In its active state, the state machine 83 of the digital capture port generates acquisition strobe pulses in order to acquire the digital output signal of the DUT, and in the quiescent state the state machine 83 interrupts generation of acquisition strobe pulses.

Figure 2:
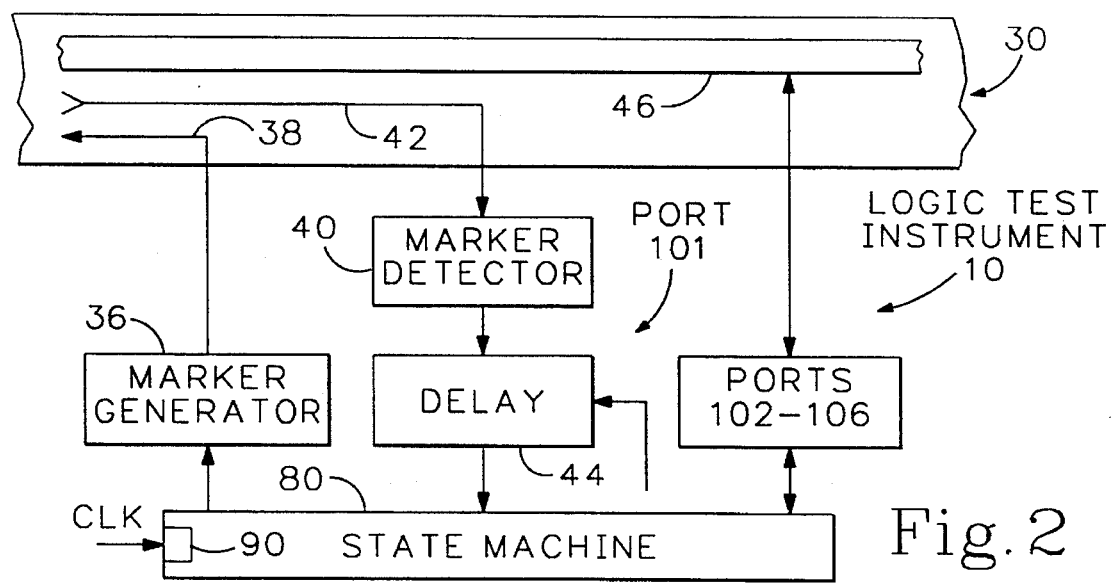
FIG. 2 illustrates in greater detail a component of the apparatus shown in FIG. 1.

Each of the instruments 10–16 comprises six bidirectional communication ports. The tester also includes an interconnection matrix 30 whereby the bidirectional communication ports are connected to each other in a manner that allows simultaneous bidirectional communication between each two state machines. Thus, as shown in FIGS. 1 and 2, the logic test instrument 10 comprises bidirectional communication ports 101–106 that are connected through the matrix 30 to ports 110, 120, 130, 140, 150 and 160 of the T & M instruments 11–16 respectively for providing communication between the state machine 80 and each of the state machines 81–86. Additional ports (not shown) provide communication between each other pair of state machines.

The state machines 80–86 all operate under control of a master clock that is generated by a master clock generator 24. Clock lines extend from the master clock generator 24 to each of the state machines 80–86. The state machines have respective internal timing generators 90–96, each of which operates in response to the master clock and generates a local clock at a frequency that is related to the frequency of the master clock by a predetermined integer ratio that is not necessarily the same as the integer ratio that relates the local clock frequency of any other state machine to the master clock frequency. Therefore, all the local clocks are coherent and remain coherent even if the frequency of the master clock changes. Different integer ratios allow different rates of state progression in the different state machines. In response to its internal time domain, the state machine 80 of the logic test instrument 10 steps through a progression of states that depends on the particular test that is to be executed. Similarly, the state machine of each T & M instrument 11–16 that is used for a particular test operates in its own internal time domain and steps through a progression of states that depends on commands applied to the instrument by the logic test instrument 10.

FIG. 2 illustrates in somewhat greater detail the interface between the logic test instrument 10 and the matrix 30. The port 101 communicates with the port 110 over dedicated lines 38 and 42. Similarly, the ports 102–106 communicate with ports 120–160 over pairs of lines designated generally at 46. The port 101 comprises a marker generator 36 connected to an output line of the state machine 80. The output line might be the output of one of the pin channels of the logic test instrument. For certain states of the state machine 80, there are precursor states that occur in advance and result in a signal being provided to the marker generator 36. In response to this signal, the marker generator, 36 provides a marker signal to the state machine 81 of the analog waveform generator 11 by way of the dedicated line 38 and the port 110 (FIG. 1). The marker signal is received at the port 110 at a precisely defined time in advance of occurrence of the state that is anticipated by the precursor state. The port 101 also includes a marker signal detector 40 that detects a marker received from the state machine 81 by way of the port 110 and the dedicated line 42. A controllable delay element 44 is interposed between the marker detector 40 and the state machine 80, so that the state machine 80 receives a signal indicating that a marker from the analog waveform generator has been detected at a controllable time after detection of the marker. Each of the other bidirectional communication ports is similarly equipped with a marker generator, a marker receiver and a controllable delay element. Thus, the marker signal received at the port 110 is subject to a precisely defined delay before being received by the state machine 81.

Not all T & M instruments are used in carrying out a given test. For example, in order to test conversion linearity of an ADC using the tester shown in FIGS. 1 and 2, the tester is configured to use the logic test instrument 10, the analog waveform generator 11 and the digital capture port 13. The logic test instrument 10, the analog waveform generator 11 and the digital capture port 13 each execute a predetermined sequence of steps.

In order to test conversion linearity of an ADC, the analog waveform generator may be programmed to generate a stairstep waveform under control of its local clock. In setting up the test, the operator decides on the duration and frequency of the calibration cycles of the ADC, and programs the logic test instrument to emit periodically a discrete reset pulse (ADC zero—FIG. 3, waveform F), which is applied to the reset pin of the ADC through the socket 20, at a selected time relative to the master clock. Therefore, the logic test instrument 10 periodically causes the ADC to execute a calibration cycle of a selected duration. The operator also programs the state machine 80 to emit a vector trigger start pulse 50 (waveform E) just before the start of each conversion cycle and a vector trigger stop pulse 52 just before the end of each conversion cycle. The vector trigger signal is applied to the port 101. The port 101 responds to the vector trigger signal by generating an LT trigger 1 signal (waveform B) that is applied to the port 110. The LT trigger 1 signal is delayed relative to the vector trigger signal to ensure that it is received by the state machine of the analog waveform generator at an accurately repeatable time in advance of entry of the logic test instrument into the anticipated state, i.e. the state in which the ADC zero pulse ends.

The port 110 responds to the LT trigger 1 signal by delaying it for a predetermined time and applying the delayed LT trigger 1 signal to the state machine 81. The state machine 81 responds to a delayed LT trigger 1 start pulse 50' by entering its active state, so that on the next pulse of the local clock the output voltage of the analog waveform generator increases by one increment. The state machine 81 responds to a delayed LT trigger 1 stop pulse 52' by entering its quiescent state, so that the increment in output voltage on the next local clock pulse is the last until the next start pulse 50' is received. Therefore, the output voltage of the analog waveform generator increases in an intermittent, stepwise fashion under control of the LT trigger 1 pulses. The intermittent stepwise increasing of the output voltage of the analog waveform generator continues within the range of the output voltage of the analog waveform generator.

Figure 3:
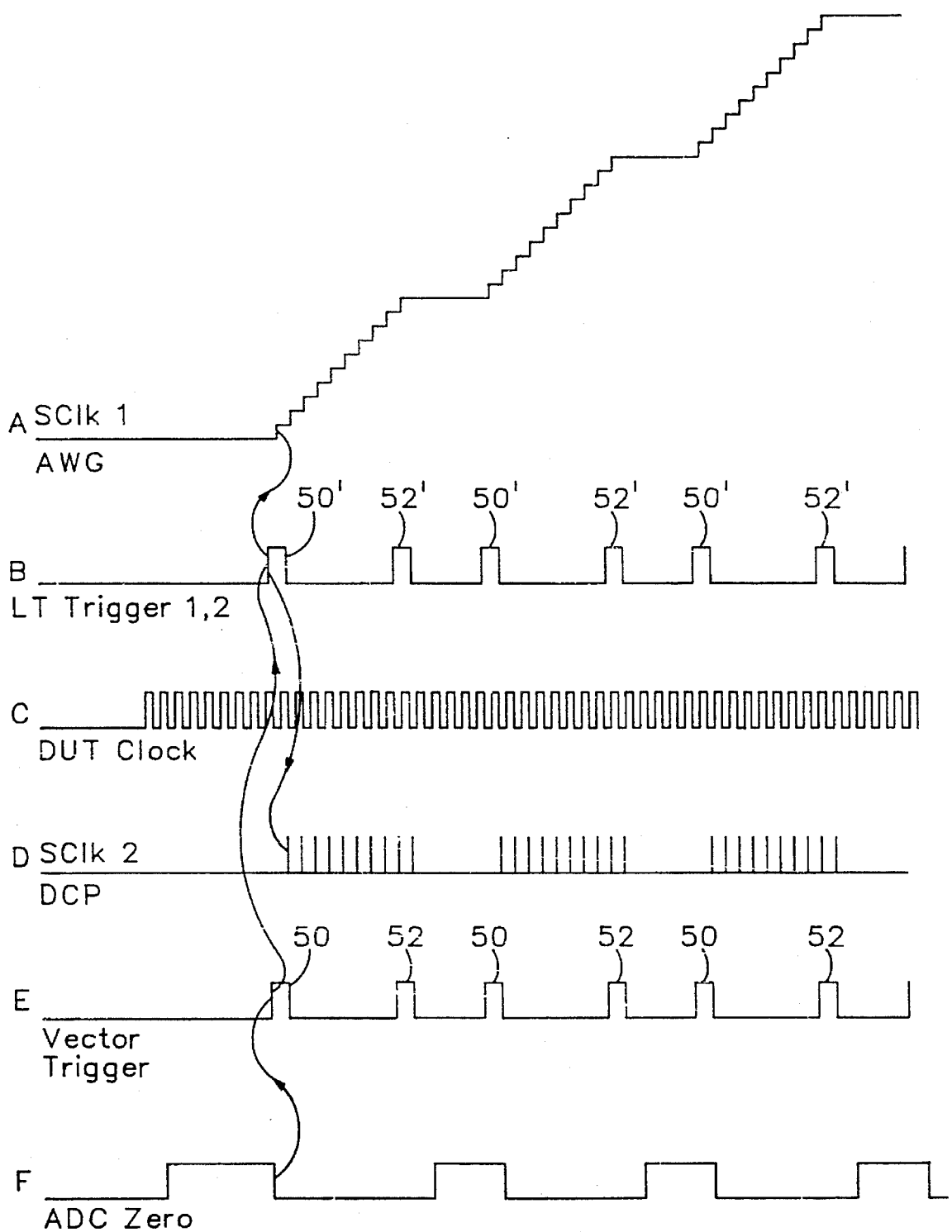
FIG. 3 is a graph illustrating use of the apparatus shown in FIGS. 1 and 2 to carry out a discontinuous linearity test on an unstable configuration analog-to-digital converter.

The vector trigger pulses are also applied to the port 103. The port 103 responds to the vector trigger signal by generating an LT trigger 2 signal that is applied to the port 130. (Although waveform B in FIG. 3 is indicated as representing both the LT trigger 1 signal and the LT trigger 2 signal, the two signals would generally be offset in time relative to each other.) The port 130 responds to the LT trigger 2 signal by supplying a delayed LT trigger 2 signal to the state machine 83 of the digital capture port 13. The digital capture port 13 is connected to the digital output pins of the ADC 22 and acquires the digital output signal of the ADC for analysis relative to the state of the analog waveform generator. The state machine 83 responds to a delayed LT trigger 2 start pulse by entering its active state, so that on the next pulse of the local clock the digital capture port commences generating periodic acquisition strobe pulses (waveform D). The state machine 83 responds to a delayed LT trigger 2 stop pulse by entering its quiescent state, so that the strobe pulse generated on the next local clock pulse is the last until the next LT trigger 2 start pulse is received.

The delay elements of the bidirectional communication ports are calibrated so that the predetermined time that elapses between receipt of a marker, such as the delayed LT trigger 1 start pulse, and the resulting change in state of the state machine that received the delayed marker is such that the change in state of the state machine occurs at a selected time relative to the change in state that is anticipated by the marker. For example, in order to acquire valid data for the discontinuous conversion linearity test, the predetermined times that control entry of the state machines of the analog waveform generator and the digital capture port into the active states must be such that when the digital capture port generates an acquisition strobe pulse, the ADC is executing a conversion cycle and the state machine of the analog waveform generator is in its active state. These times are determined by connecting a calibration device to the socket 20 in lieu of the ADC 22. The calibration device may be the autocalibration system sold by Credence Systems Corporation as an option to its Vista series testers. In order to determine the proper delay for the analog waveform generator, the calibration device detects arrival at the socket 20 of both the change of state indicating start of the conversion cycle (falling edge of ADC zero) and the stepwise increase in the output voltage of the analog waveform generator for various settings of the delay element in the port 110, and the delay imposed by the delay element of the port 110 is selected such as to provide the desired relationship. Similarly, in order to determine the proper time delay for the digital capture port, the calibration device emits a pulse signal to the digital capture port by way of the socket 20 and for various values of the delay element in the port 130 a determination is made as to whether the leading edge of the pulse signal has been acquired by the capture port. The delay imposed by the delay element is selected so that the leading edge of the pulse signal is acquired.

It will therefore be seen that use of the tester described with reference to FIGS. 1 and 2 allows operation of the analog waveform generator and digital capture port to be controlled relative to the state of the state machine 80, as manifested by the vector trigger signal, rather than simply in response to passage of time, as in a timing driven tester.

Another figure of merit relevant to an ADC can be derived from analysis of data values acquired in response to a sinusoidal stimulus signal. The Fast Fourier transform (FFT) algorithm allows rapid analysis of a data record representative of a periodic waveform provided that the record contains $2^{**}n$, where n is an integer, data points spanning precisely an integer number of cycles of the periodic waveform. In the case of an ADC with an unstable sampler, it is impossible to acquire sufficient data between two consecutive calibration cycles. The apparatus shown in FIGS. 1 and 2 may be used to acquire a data record in several segments distributed over multiple cycles of the sinusoidal stimulus signal without corrupting the record with a large volume of spurious data.

In order to carry out this test, the state machine 81 of the analog waveform generator is programmed to generate voltage samples at a high frequency by stepping through a progression of states in response to its local clock, the samples being related in accordance with a sinusoidal function of time. The sampled signal is low-pass filtered, and the resulting continuous analog output signal (FIG. 4, waveform B) is applied to the DUT. The operator determines how many cycles of the sinusoidal waveform should be acquired, and the record length, i.e. the number of samples that should be taken.

Figure 4:
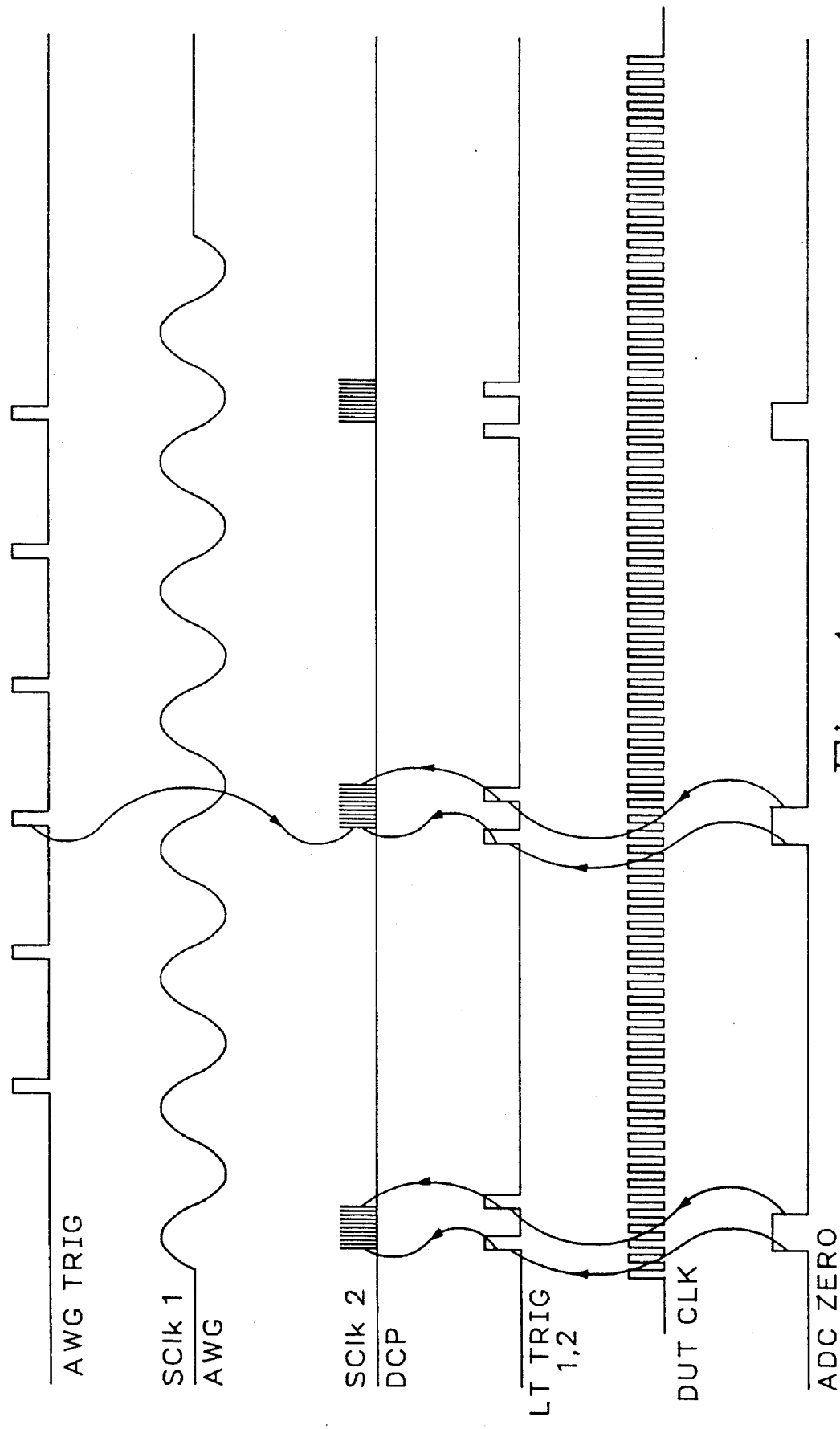
FIG. 4 is a graph illustrating use of the apparatus shown in FIGS. 1 and 2 to carry out a further test on an unstable configuration analog-to-digital converter.

As shown in FIG. 4, the ADC zero signal emitted by the logic test instrument periodically includes a pulse that places the ADC in its active state. In anticipation of entry into the active state of the ADC, state machine 80 of the logic test instrument generates a vector trigger signal, which it applies to the ports 101 and 103. The ports 101 and 103 emit an LT trigger 1 signal and an LT trigger 2 signal (waveform C) respectively, each with a predetermined delay following the vector trigger signal. As in the case of FIG. 3, the two LT trigger signals will not generally be in phase. The LT trigger 1 signal is applied to the analog waveform generator and the LT trigger 2 signal is applied to the digital capture port. In response to the first LT trigger 2 start pulse, the digital capture port generates acquisition strobe pulses, for capturing the digital output of the ADC. In response to the first LT trigger 1 stop pulse, the analog waveform generator stores the count representative of its state at a predetermined later time, and in response to the first LT trigger 2 stop pulse the digital capture port stops generating acquisition strobe pulses. The aforesaid predetermined later time is such that the count stored by the analog waveform generator corresponds to the end of the acquisition made by the digital capture port.

On subsequent cycles of the sinusoidal output, the analog waveform generator generates an AWG trigger pulse (waveform A) in advance of the time that the analog waveform generator reaches the state represented by the count stored in response to the first LT trigger 1 stop pulse, and the AWG trigger pulse is applied over the interconnection matrix 30 to the digital capture port. Moreover, the second LT trigger 2 start pulse does not cause the digital capture port to generate acquisition strobe pulses but rather arms the digital capture port so that on receiving the delayed AWG trigger pulse, the digital capture port will resume generation of acquisition strobe pulses and will capture the output signal of the ADC resulting from sampling and quantizing a segment of the cycle of the analog waveform that immediately follows the segment that was sampled and quantized during the preceding succession of acquisition strobe pulses. In response to the second LT trigger 2 stop pulse, the digital capture port stops generating acquisition strobe pulses, and in response to the second LT trigger 1 stop pulse the analog waveform generator stores the count representative of its state at the predetermined later time. This sequence of operation continues until the digital capture port has acquired a complete record for analysis.

The tester shown in FIGS. 1 and 2 may also be used to test a more complex device, such as one that includes both an ADC and a circuit for digital processing of the output of the ADC. In testing such a device, the logic test instrument 10 of the tester is connected to a digital control port of the digital processing circuit and the digital capture port is connected to the output of the digital processing circuit. The logic test instrument 10 might, for example, examine the signals provided at the digital control port in order to ascertain whether the digital processing circuit has determined that the output of the ADC is stable, so that a particular action can be invoked.

In the test described with reference to FIG. 3, the logic test instrument is the master instrument and the analog waveform generator and digital capture port are slave instruments, whereas in the case of the test described with reference to FIG. 4, the analog waveform generator functions as a master instrument. It will therefore be seen that the illustrated tester has the ability to alter the nature of master-slave timing relationships between ATE system instruments.

The state machines of the different instruments within the test system execute with independently specifiable timing of state alterations. Time correlation between particular states-of-interest found within these separately executing state progressions are established arbitrarily.

It will be appreciated that the invention is not restricted to the particular embodiment that has been described, and that variations may be made therein without departing from the scope of the invention as defined in the appended claims and equivalents thereof. For example, the invention is not restricted to apparatus for testing monolithic integrated circuits but is also applicable to testing of hybrid integrated circuits and multiple integrated circuits mounted on a circuit board. Furthermore, the invention is not restricted to the testing of electronic devices, since with suitable stimulus and acquisition instruments it may also be applied to integrated optic devices.

The test described with reference to FIG. 4 shows that the apparatus shown in FIGS. 1 and 2 is not restricted to each T & M instrument operating as a slave relative to the logic test instrument. In the case of the test described with reference to FIG. 4, the analog waveform generator itself serves as a master instrument controlling operation of the digital capture port.

Since each of the instruments is autonomous and the state machine of each slave instrument executes its progression of states in response to an event marker, the time of occurrence of the event marker signal does not affect the slave instrument executes its progression of states. On receipt of the event marker, state machine of the slave instrument executes its progression of states without regard to operation of the master instrument or any other slave instrument, unless it receives another event marker.

It will be appreciated that it is necessary that the local clock generators be capable of controlling accurately the delay between receiving a delayed event marker and the response to the delayed marker, and that the position of the LT trigger stop pulse be controlled very accurately so that it arrives between two clocks of the analog waveform generator or digital capture port and there is no ambiguity over which clock of the analog waveform generator or digital capture port is the next (and last) pulse in the active cycle. It is relatively easy to control the start of generation of acquisition strobe pulses relative to receipt of the LT trigger 2 start pulse, but it is much more difficult to control accurately the time to discontinue generation of acquisition strobe pulses relative to the LT trigger 2 start pulse, and therefore ending of the operation of generating acquisition strobe pulses is controlled by the LT trigger 2 stop pulse.

I claim:

1. Apparatus for testing an integrated circuit device (DUT) having a port for inputting and outputting signals respectively to and from the DUT, said apparatus comprising:

a plurality of instruments each having multiple states that occur in a predetermined sequence, at least one of the instruments being a stimulus instrument having an output port connected to the port of the DUT for applying a stimulus signal to the DUT and at least one of the instruments being a response instrument having an input port connected to the port of the DUT for receiving a response signal outputted by the DUT, and an interconnection matrix connected to each of said instruments for communicating event marker signals among the instruments, and wherein at least a first of the instruments is an emitting instrument that emits an event marker signal by way of the interconnection matrix at a predetermined time in advance of entering a predefined state, and at least a second of the instruments is a receiving instrument that responds to receipt of an event marker signal by way of the interconection matrix in a predetermined manner after lapse of a predetermined time.

2. Apparatus according to claim 1, wherein each instrument is an emitting and receiving instrument and comprises a state machine and a plurality of bidirectional communication ports connecting the state machine to the interconnection matrix for allowing bidirectional communication between each two state machines by way of respective communication ports and the interconnection matrix, and wherein each bidirectional communication port comprises a marker signal generator for emitting a marker signal in response to a signal received from the state machine, a marker signal detector connected to receive a marker signal from the matrix and to generate a signal in response thereto, and a controllable delay element connected between the marker signal detector and the state machine.

3. Apparatus according to claim 1, wherein said instruments comprise a logic test instrument, an analog waveform generator, and a digital capture port.

4. Apparatus according to claim 1, wherein said instruments comprise a logic test instrument, an analog waveform generator, and a digitizer.

5. Apparatus according to claim 1, wherein said first instrument is an emitting and receiving instrument and comprises a state machine and a bidirectional communication port connected between said state machine and the interconnection matrix, and wherein the bidirectional communication port comprises a marker signal generator connected to said state machine for emitting a marker signal in response to a signal received from said state machine, a marker signal detector connected to receive a marker signal from the matrix and to generate a signal in response thereto, and a controllable delay element connected between the marker signal detector and said state machine.

6. Apparatus according to claim 1, wherein the first instrument is a logic test instrument and the second instrument is an analog waveform generator, or a digital capture port, or a digitizer.

7. Apparatus according to claim 1, where the first instrument is an analog waveform generator and the second instrument is a logic test instrument, or a digital capture port, or a digitizer.

8. Apparatus according to claim 1, comprising a master clock generator for generating a master clock, and wherein each instrument has a clock input connected to receive the master clock and comprises an internal timing generator that generates a local clock at a frequency that is equal to the frequency of the master clock multiplied by a predetermined rational number.

9. Apparatus according to claim 8, wherein the predetermined rational number is an integer.

10. Apparatus for testing an integrated circuit device (DUT) having a port for inputting and outputting signals respectively to and from the DUT, said apparatus comprising:

a logic test instrument having multiple states that occur in a predetermined sequence, the logic test instrument having a test signal port connected to the port of the DUT for applying a stimulus signal to the DUT and also having a marker signal communication port, the logic test instrument emitting an event marker signal by way of its marker signal communication port at a predetermined time in advance of entering a predefined state, a response instrument having multiple states that occur in a predetermined sequence, the response instrument having a test signal port connected to the port of the DUT for receiving a response signal provided by the DUT and also having a marker signal communication port, the response instrument responding to receipt of an event marker signal by way of its marker signal communication port in a predetermined manner after lapse of a predetermined time, and an interconnection matrix connected to the marker signal communication ports of said instruments for communicating event marker signals between the instruments.

11. Apparatus according to claim 10, wherein the response instrument emits an event marker signal by way of its marker signal communication port at a predetermined time in advance of entering a predefined state and the logic test instrument responds to receipt of an event marker signal by way of its marker signal communication port in a predetermined manner after lapse of a predetermined time.

12. Apparatus according to claim 11, wherein each instrument comprises a state machine and a bidirectional marker signal communication port connecting the state machine to the interconnection matrix for allowing bidirectional communication between the state machines by way of the marker signal communication ports and the interconnection matrix, and wherein each marker signal communication port comprises a marker signal generator for emitting a marker signal in response to a signal received from the state machine, a marker signal detector connected to receive a marker signal from the matrix and to generate a signal in response thereto, and a controllable delay element connected between the marker signal detector and the state machine.

13. Apparatus according to claim 10, wherein the response instrument is a digital capture port or a digitizer.

14. Apparatus according to claim 10, comprising a master clock generator for generating a master clock, and wherein each instrument has a clock input connected to receive the master clock and comprises an internal timing generator that generates a local clock at a frequency that is a predetermined integer ratio of the frequency of the master clock.

15. Apparatus according to claim 10, wherein the logic test instrument and the response instrument each comprise two marker signal communication ports connected to the interconnection matrix, and the apparatus further comprises a stimulus instrument having multiple states that occur in a predetermined sequence, the stimulus instrument having a test signal port connected to the port of the DUT for applying a stimulus signal to the DUT and also having two marker signal communication ports, the stimulus instrument responding to receipt of an event marker signal by way of a marker signal communication port in a predetermined manner after lapse of a predetermined time, and wherein the interconnection matrix is connected to the marker signal communication ports of the stimulus instrument for communicating event marker signals between the stimulus instrument and the logic test instrument and for communicating event marker signals between the stimulus instrument and the response instrument.

16. Apparatus according to claim 15, wherein the stimulus instrument emits an event marker signal by way of a marker signal communication port thereof at a predetermined time in advance of entering a predefined state.

17. Apparatus according to claim 16, wherein the stimulus instrument comprises a state machine and two bidirectional marker signal communication ports connecting the state machine to the interconnection matrix, and wherein each bidirectional marker signal communication port of the stimulus instrument comprises a marker signal generator for emitting a marker signal in response to a signal received from the state machine of the stimulus instrument, a marker signal detector connected to receive a marker signal from the matrix and to generate a signal in response thereto, and a controllable delay element connected between the marker signal detector and the state machine of the stimulus instrument.

18. Apparatus according to claim 10, wherein the number of instruments is N and each instrument comprises a state machine and (N−1) bidirectional marker signal communication ports connecting the state machine to the interconnection matrix for emitting and receiving event marker signals, and the interconnection matrix has N*(N−1)/2 bidirectional communication paths whereby each marker signal communication port is connected to each other marker signal communication port.

19. Apparatus for testing an integrated circuit device (DUT) having a port for inputting and outputting signals respectively to and from the DUT, said apparatus comprising:

a logic test instrument having multiple states that occur in a predetermined sequence, the logic test instrument having a test signal port connected to the port of the DUT for applying a stimulus signal to the DUT and also having a bidirectional marker signal communication means, the logic test instrument emitting an event marker signal by way of its bidirectional marker signal communication means a predetermined time in advance of entering a predefined state and responding to receipt of an event marker signal by way of its bidirectional marker signal communication means in a predetermined manner after lapse of a predetermined time, a first response instrument having multiple states that occur in a predetermined sequence, the first response instrument having a test signal port connected to the port of the DUT for receiving a response signal provided by the DUT and also having a marker signal communication means, the first response instrument responding to receipt of an event marker signal by way of its marker signal communication means in a predetermined manner after lapse of a predetermined time, a second response instrument having multiple states that occur in a predetermined sequence, the second response instrument having a test signal port connected to the port of the DUT for receiving a response signal provided by the DUT and also having a marker signal communication means, the second response instrument emitting an event marker signal by way of its marker signal communication means at a predetermined time in advance of entering a predefined state, and an interconnection matrix connected to the bidirectional marker signal communication means of the logic test instrument and the respective marker signal communication means of said first and second response instruments for communicating event marker signals among the instruments.

20. Apparatus according to claim 19, wherein the first response instrument comprises a digital capture port or a digitizer.

21. Apparatus according to claim 19, wherein the logic test instrument comprises a state machine, and the bidirectional marker signal communication means comprises at least two bidirectional marker signal communication ports, each of which comprises a marker signal generator connected to said state machine for emitting a marker signal in response to a signal received from said state machine, a marker signal detector connected to receive a marker signal from the matrix and to generate a signal in response thereto, and a controllable delay element connected between the marker signal detector and said state machine.

22. Apparatus according to claim 19, wherein the number of instruments is N and each instrument comprises a state machine and (N−1) bidirectional marker signal communication ports connecting the state machine to the interconnecion matrix for emitting and receiving event marker signals, and the interconnection matrix has N*(N−1)/2 bidirectional communication paths whereby each marker signal communication port is connected to each other marker signal communication port.

23. Apparatus according to claim 19, wherein the first response instrument is a digitizer and the second response instrument is a digital capture port.

* * * * *